United States Patent
Lee et al.

(10) Patent No.: US 10,964,570 B2
(45) Date of Patent: Mar. 30, 2021

(54) SEMICONDUCTOR WAFER STORAGE SYSTEM AND METHOD OF SUPPLYING FLUID FOR SEMICONDUCTOR WAFER STORAGE

(71) Applicant: SAMSUNG ELECTRONICS CO., LTD., Suwon-si (KR)

(72) Inventors: Sangkyung Lee, Hwaseong-si (KR); Yong-Jun Ahn, Suwon-si (KR); Taijo Jeon, Suwon-si (KR); Kyubum Cho, Hwaseong-si (KR); Jongsam Kim, Suwon-si (KR); Gi-Nam Park, Incheon (KR); Chul-Jun Park, Seoul (KR); Junyong Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/529,082

(22) Filed: Aug. 1, 2019

(65) Prior Publication Data
US 2020/0176293 A1 Jun. 4, 2020

(30) Foreign Application Priority Data

Dec. 3, 2018 (KR) .......................... 10-2018-0153633
Apr. 4, 2019 (KR) .......................... 10-2019-0039788

(51) Int. Cl.
*H01L 21/673* (2006.01)
*H01L 21/67* (2006.01)
*B05B 1/30* (2006.01)

(52) U.S. Cl.
CPC .......... *H01L 21/67393* (2013.01); *B05B 1/30* (2013.01); *H01L 21/67017* (2013.01)

(58) Field of Classification Search
None
See application file for complete search history.

(56) References Cited

U.S. PATENT DOCUMENTS

| 6,447,632 B1 * | 9/2002 | Shinozuka ................ C23F 3/00 118/715 |
| 8,596,312 B2 * | 12/2013 | Natsume .......... H01L 21/67379 141/98 |
| 9,412,631 B2 | 8/2016 | Jang et al. |
| 9,496,162 B2 | 11/2016 | Yoo et al. |
| 9,868,140 B2 | 1/2018 | Rebstock |
| 10,010,913 B2 | 7/2018 | Kaise et al. |
| 2005/0252571 A1 * | 11/2005 | Nakano ............. H01L 21/67772 141/66 |

(Continued)

FOREIGN PATENT DOCUMENTS

| JP | 6271354 B2 | 1/2018 |
| KR | 10-1352555 B1 | 1/2014 |

(Continued)

*Primary Examiner* — Reema Patel
(74) *Attorney, Agent, or Firm* — Lee IP Law, PC

(57) ABSTRACT

A semiconductor wafer storage system includes a container that provides a space in which a semiconductor wafer is to be stored, a fluid supply that provides a fluid to the container, a connection part that receives the fluid from the fluid supply and transfers the fluid to the container, and a nozzle part that connects the connection part to the container. The container may include a coupling plate to which the nozzle part is coupled, and the nozzle part may include a first nozzle and a second nozzle.

16 Claims, 5 Drawing Sheets

(56) References Cited

U.S. PATENT DOCUMENTS

2012/0236097 A1* 9/2012 Yokozawa ............. B41J 11/007
                                                                  347/102
2013/0255793 A1* 10/2013 Watanabe ................ F17D 3/00
                                                                   137/14

FOREIGN PATENT DOCUMENTS

| KR | 10-1418812 B1 | 7/2014 |
| KR | 10-1418733 B1 | 8/2014 |
| KR | 10-1439168 B1 | 9/2014 |
| KR | 10-1865636 B1 | 6/2018 |

* cited by examiner

SEMICONDUCTOR WAFER STORAGE SYSTEM AND METHOD OF SUPPLYING FLUID FOR SEMICONDUCTOR WAFER STORAGE

CROSS-REFERENCE TO RELATED APPLICATION

Korean Patent Application No. 10-2018-0153633, filed on Dec. 3, 2018 and Korean Patent Application No. 10-2019-0039788, filed on Apr. 4, 2019, in the Korean Intellectual Property Office, and entitled: "Semiconductor Wafer Storage System and Method of Supplying Fluid for Semiconductor Wafer Storage," is incorporated by reference herein in its entirety.

BACKGROUND

1. Field

Embodiments relate to a semiconductor wafer storage system and a method of supplying fluid for semiconductor wafer storage.

2. Description of the Related Art

Wafers may be stored during a standby time between processes in fabricating semiconductor devices. A certain space may be needed to keep the wafers. A storage apparatus may be used to provide the space for wafer storage.

SUMMARY

Embodiments are directed to a semiconductor wafer storage system, including a container that provides a space in which a semiconductor wafer is to be stored, a fluid supply that provides a fluid to the container, a connection part that receives the fluid from the fluid supply and transfers the fluid to the container, and a nozzle part that connects the connection part to the container. The container may include a coupling plate to which the nozzle part is coupled, and the nozzle part may include a first nozzle and a second nozzle.

Embodiments are also directed to a semiconductor wafer storage system, including a wafer container accommodating a semiconductor wafer, a fluid supply providing a fluid in the wafer container, a nozzle part connecting the wafer container into the fluid supply and providing the fluid in the wafer container, and an exhaust part exhausting the fluid in the wafer container. The wafer container has a shape of a hexahedron and the nozzle part is adjacent corners of a lower surface of the hexahedron.

Embodiments are also directed to a semiconductor wafer storage system including a gas supply providing an inert gas, and a wafer container having a coupling plate connected to the gas supply and accommodating a semiconductor wafer. The wafer container includes nozzle holes adjacent corners of the coupling plate to provide the inert gas in the wafer container, and an exhaust hole adjacent one of the corners of the coupling plate to exhaust the inert gas in the wafer container.

BRIEF DESCRIPTION OF THE DRAWINGS

Features will become apparent to those of skill in the art by describing in detail example embodiments with reference to the attached drawings in which.

DETAILED DESCRIPTION

Figure 1:
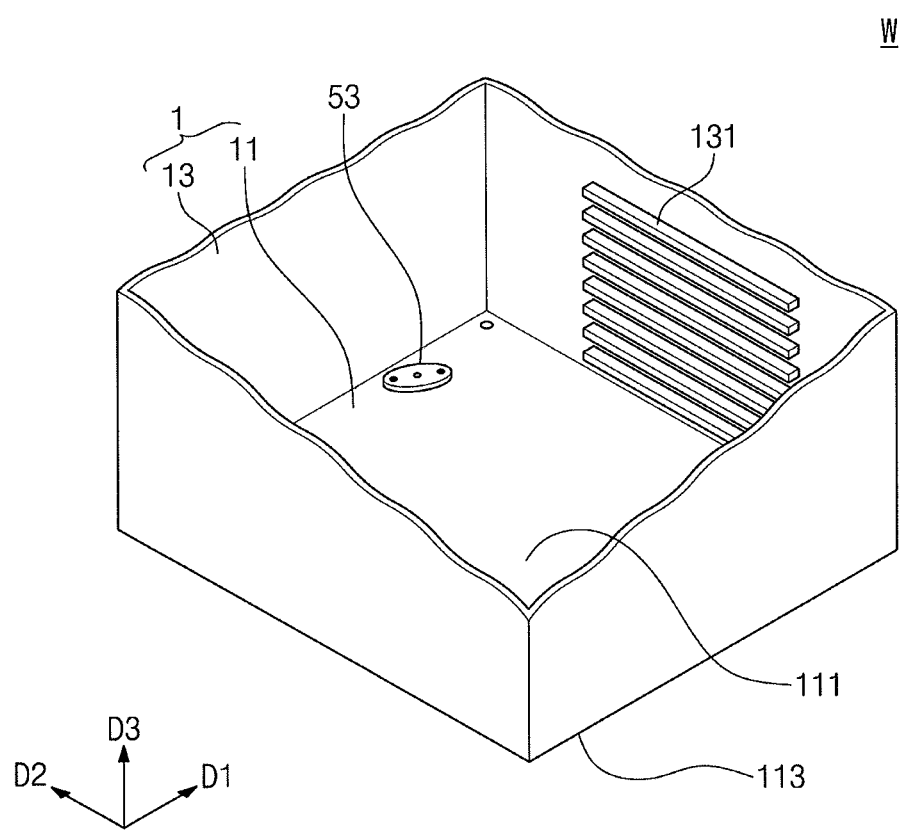
FIG. 1 illustrates a partially cutaway perspective view showing a semiconductor wafer storage system according to an example embodiment.

FIG. 1 illustrates a partially cutaway perspective view showing a semiconductor wafer storage system according to an example embodiment.

In FIG. 1, a direction D1 may be referred to hereinafter as a first direction, a direction D2 as a second direction, and a direction D3 as a third direction. The first direction D1 may be substantially perpendicular to the second direction D2. The third direction D3 may be substantially perpendicular to the first and second directions D1 and D2.

Referring to FIG. 1, a semiconductor wafer storage system W may include a container 1. For example, the container 1 may be FOUP (Front Opening Unified Pod). The container 1 may accommodate wafers or the like. The container 1 may store wafers. The container 1 may provide a space in which wafers are stored. The space in the container 1 may be called an inner space.

The container 1 may have a cuboidal shape or a cubic shape, for example. The container 1 may include a coupling plate 11 and a side wall 13. In the case that the container 1 has the cubic shape, the space in the container 1 may have a volume of, for example, 64000 cm$^3$ (having dimensions of, for example, 40 cm×40 cm×40 cm) or 64 liters. The container 1 may be stored in a stocker (not shown) to be provided a fluid (purge gas) to prevent wafer oxidation and/or wafer contamination.

The coupling plate 11 may extend on a plane defined by the first direction D1 and the second direction D2. The coupling plate 11 may be associated with fluid supply members, which will be discussed below. In an example embodiment, the coupling plate 11 may be a bottom plate of the container 1. In another implementation, the coupling plate 11 may be a top plate or a side wall of the container 1. The coupling plate 11 may have a rectangular shape, for example.

The coupling plate 11 may have a first surface 111 and a second surface 113. In an example embodiment, the first surface 111 may be a top surface of the coupling plate 11. The second surface 113 may be a bottom surface of the coupling plate 11. In other implementations, when the coupling plate 11 is a top or side plate of the container 1, the first and second surfaces 111 and 113 may not be the top and bottom surfaces.

The side wall 13 may extend in the third direction D3 from the coupling plate 11. The side wall 13 may surround the inner space of the container 1. The side wall 13 may be provided with a receiving projection 131. The receiving projection 131 may extend in the second direction D2. The receiving projection 131 may receive a wafer or the like. The receiving projection 131 may be provided in plural. The plurality of receiving projections 131 may be disposed spaced apart from each other in the third direction D3. Thus, a plurality of wafers may be accommodated in one container 1. Although not shown, the container 1 may further include a top plate covering the side wall 13. The inner space of the container 1 may be isolated from the outside. In this description, the term "isolated" may mean hermetically sealed allowing no fluid to flow between two spaces without separate handling.

Figure 2:
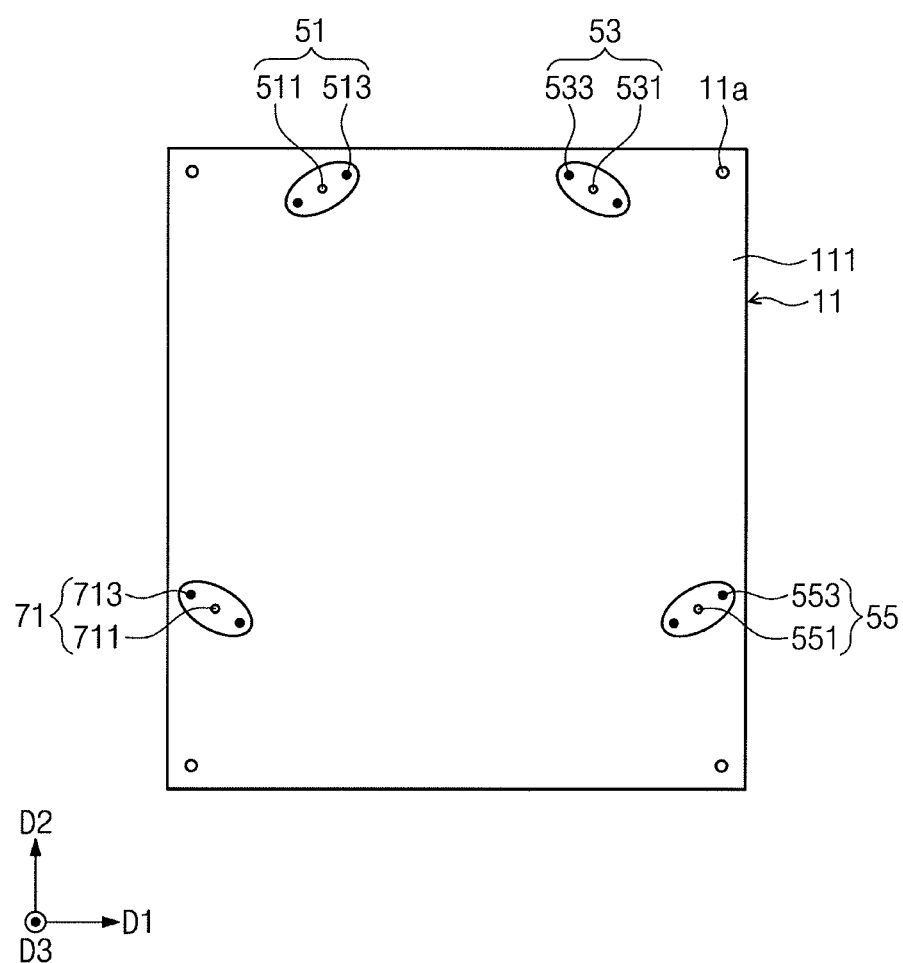
FIG. 2 illustrates a plan view showing a coupling pate of a semiconductor wafer storage system according to an example embodiment.

FIG. 2 illustrates a plan view showing a coupling pate of a semiconductor wafer storage system according to an example embodiment.

Referring to FIG. 2, the coupling plate 11 may have at least one fastening hole 11a. A fastening means (not shown) may be inserted into the fastening hole 11a. The fastening means inserted into the fastening hole 11a may rigidly place the coupling plate 11 in position.

The coupling plate 11 may be associated with a nozzle part. A portion of the nozzle part may be disposed on the first surface 111 of the coupling plate 11. In an example embodiment, the first surface 111 may be a top surface of the coupling plate 11. The nozzle part may be provided in plural.

In an example embodiment, the nozzle part may include a first nozzle 51, a second nozzle 53, and a third nozzle 55. The first nozzle 51, the second nozzle 53, and the third nozzle 55 may be disposed at different locations of the coupling plate 11. In an example embodiment, the first nozzle 51 may be disposed spaced apart from the second nozzle 53 in a reverse direction to the first direction D1. The third nozzle 55 may be disposed spaced apart from the second nozzle 53 in a reverse direction to the second direction D2. In another implementation, the first, second, and third nozzles 51, 53, and 55 may be positioned at various locations. In an example embodiment, the first, second, and third nozzles 51, 53, and 55 may be spaced apart along an entire width and/or length of the coupling plate 11 so as to provide increase coverage by the fluid flowing through the first, second, and third nozzles 51, 53, and 55 into the inner space of the container 1. For example, a distance between two of the first, second, and third nozzles 51, 53, and 55 may be at least one half of a width and/or length of the coupling plate 11.

The first nozzle 51 may be coupled by a coupling means 513 to the coupling plate 11. The fastening means 513 may include a bolt and a nut. The first nozzle 51 may be provided with a first aperture 511. The first aperture 511 may penetrate from the first surface 111 to the second surface 113 of the coupling plate 11. The first aperture 511 may spatially connect an outer space to the inner space of the container (see 1 of FIG. 1). The first aperture 511 may allow the fluid to enter the inner space of the container 1. The second nozzle 53 may be coupled through a coupling means 533 to the coupling plate 11. The second nozzle 53 may be provided with a second aperture 531. The second aperture 531 may penetrate from the first surface 111 to the second surface 113 of the coupling plate 11. The second aperture 531 may spatially connect an outer space to the inner space of the container 1. The second aperture 531 may allow the fluid to enter the inner space of the container 1. The third nozzle 55 may be coupled through a coupling means 553 to the coupling plate 11. The third nozzle 55 may be provided with a third aperture 551. The third aperture 551 may penetrate from the first surface 111 to the second surface 113 of the coupling plate 11. The third aperture 551 may spatially connect an outer space to the inner space of the container 1. The third aperture 551 may allow the fluid to enter the inner space of the container 1.

The coupling plate 11 may also be associated with an exhaust part 71. The exhaust part 71 may discharge the fluid out of the inner space of the container 1. The exhaust part 71 may be coupled through a coupling means 713 to the coupling plate 11. The exhaust part 71 may be provided with an exhaust aperture 711. The exhaust aperture 711 may discharge the fluid out of the inner space of the container 1.

Figure 3:
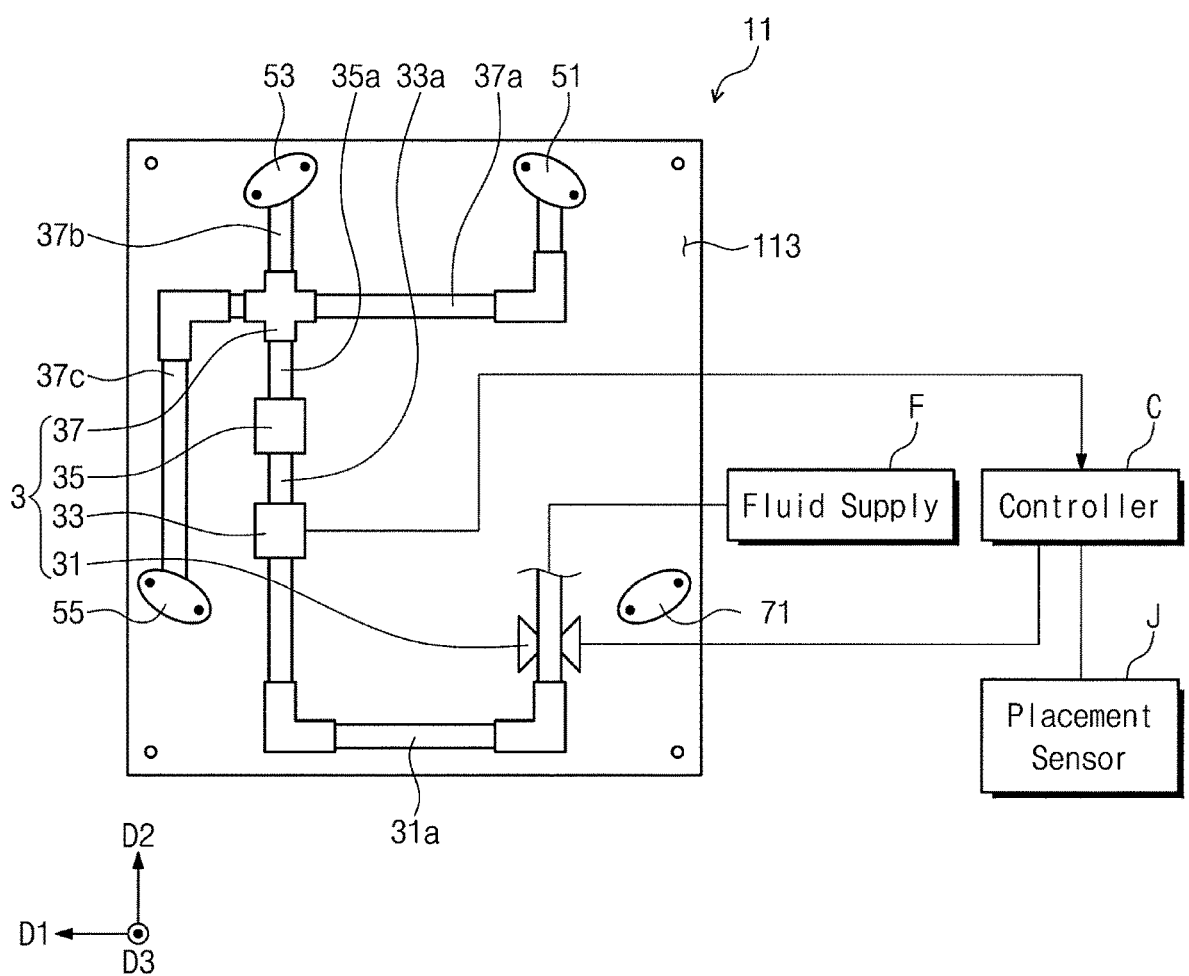
FIG. 3 illustrates a bottom view showing a semiconductor wafer storage system according to an example embodiment.

FIG. 3 illustrates a bottom view showing a semiconductor wafer storage system according to an example embodiment.

Referring to FIG. 3, the semiconductor wafer storage system may further include a fluid supply F, a connection part 3, a controller C, and a placement sensor J. A portion of the nozzle part may be disposed on the second surface 113 of the coupling plate 11. In an example embodiment, the second surface 113 may be a bottom surface of the coupling plate 11.

The fluid supply F may provide the container (see 1 of FIG. 1) with the fluid. The fluid may include an inert gas and/or a purge gas. In an example embodiment, the inert gas may include nitrogen ($N_2$) and/or argon (Ar). The inert gas may prevent oxidation of wafers accommodated in the inner space of the container 1 so that a wafer processing process may increase in yield. In an example embodiment, the fluid supply F may include an inert gas container, a compressor, or the like.

The connection part 3 may connect the fluid supply F and the container 1 to each other. The connection part 3 may receive the fluid from the fluid supply F and transfer the fluid to the container 1. The connection part 3 may include a valve 31, a flowmeter 33, a filter 35, and a manifold fitting 37. In an example embodiment, the connection part 3 may further include a first line 31a, a second line 33a, a third line 35a, a first supply line 37a, a second supply line 37b, and a third supply line 37c.

The valve 31 may be connected to the fluid supply F. In this description, the phrase "connected to" may include the meaning that two components are "directly connected to" each other, or that are "indirectly connected to" each other through other component(s). The valve 31 may block flow of the fluid or control a flow rate of the fluid supplied from the fluid supply F. In an example embodiment, the valve 31 may be a variable flow rate valve.

The flowmeter 33 may measure a flow rate of the fluid flowing after passing through the valve 31. The controller C may receive data about the flow rate measured by the flowmeter 33. In an example embodiment, the flowmeter 33 may include an electromagnetic flowmeter.

The filter 35 may filter particles, for example, minute particles, contaminants, impurities, etc., in the fluid after the fluid passes through the flowmeter 33. The filter 35 may filter solid particles, for example, minute solid particles. In an example embodiment, the filter 35 may include a particle filter. The filtering of minute particles may prevent damage of wafers accommodated in the inner space of the container 1 such that a wafer processing process may increase in yield. Wafers may be stored for a relatively long time.

The manifold fitting 37 may branch a path of the fluid flowing after passing through the filter 35. The manifold fitting 37 may cause the fluid to flow into two or more paths. In an example embodiment, the manifold fitting 37 may cause the fluid to flow into three paths. The manifold fitting 37 may cause the fluid to flow into the first nozzle 51, the second nozzle 53, and the third nozzle 55.

The first line 31a may connect the valve 31 and the flowmeter 33 to each other. The fluid that has passed through the valve 31 may flow along the first line 31a into the flowmeter 33. The second line 33a may connect the flowmeter 33 and the filter 35 to each other. The fluid that has passed through the flowmeter 33 may flow along the second line 33a into the filter 35. The third line 35a may connect the filter 35 and the manifold fitting 37 to each other. The fluid that has been filtered in the filter 35 may flow along the third line 35a into the manifold fitting 37.

The first supply line 37a may connect the manifold fitting 37 and the first nozzle 51 to each other. The fluid that has been branched at the manifold fitting 37 may flow along the first supply line 37a and then may be introduced through the first nozzle 51 into the inner space of the container 1. The second supply line 37b may connect the manifold fitting 37 and the second nozzle 53 to each other. The fluid that has been branched at the manifold fitting 37 may flow along the second supply line 37b and then may be introduced through the second nozzle 53 into the inner space of the container 1. The third supply line 37c may connect the manifold fitting 37 and the third nozzle 55 to each other. The fluid that has been branched at the manifold fitting 37 may flow along the third supply line 37c and then may be introduced through the third nozzle 55 into the inner space of the container 1. In an example embodiment, the first supply line 37a, the second supply line 37b, and the third supply line 37c may be on the second surface 113 of the coupling plate 11 and parallel thereto. The first supply line 37a, the second supply line 37b, and the third supply line 37c may be respectively coupled to the first aperture 511, the second aperture 531, and the third aperture 552 so as to be in fluid communication with the inner space of the container 1 through the respective aperture.

Distances between the manifold fitting 37 and each of the first, second, and third nozzles 51, 53, and 55 may be different from each other. The first, second, and third supply lines 37a, 37b, and 37c may have different lengths from each other.

In an example embodiments, flow rates of the fluid introduced through the first, second, and third nozzles 51, 53, and 55 into the inner space of the container 1 may be different from each other. In an example embodiment, the fluid may enter the inner space of the container 1 through the first, second, and third nozzles 51, 53, and 55 at a flow rate ratio of (1):(0.8~1.7):(0.8~1.7). In another implementation, the fluid may enter the inner space of the container 1 through the first, second, and third nozzles 51, 53, and 55 at different ratios from that mentioned above. In an example embodiment, the flow rates of the fluid introduced through the first, second, and third nozzles 51, 53, and 55 may be made to be different from each other by making the first, second, and third supply lines 37a, 37b, and 37c have different lengths from each other.

The controller C may control the semiconductor wafer storage system. The controller C may be connected to each of the valve 31, the placement sensor J, and the flowmeter 33. For example, the valve 31 may be controlled by signals transferred from the controller C. The controller C may receive signals from the placement sensor J and the flowmeter 33. In an example embodiment, the controller C may include a computer or the like.

The placement sensor J may be disposed in the inner space of the container 1. The placement sensor J may detect whether or not a wafer is placed in the inner space of the container 1. In another implementation, the placement sensor J may be disposed outside of the container. In an example embodiment, the placement sensor J may be provided in plural. The placement sensor J may be electrically connected to the controller C. The placement sensor J may transfer signals to the controller C. For example, when a wafer is positioned in the container 1, the placement sensor J may transfer signals to the controller C.

Figure 4:
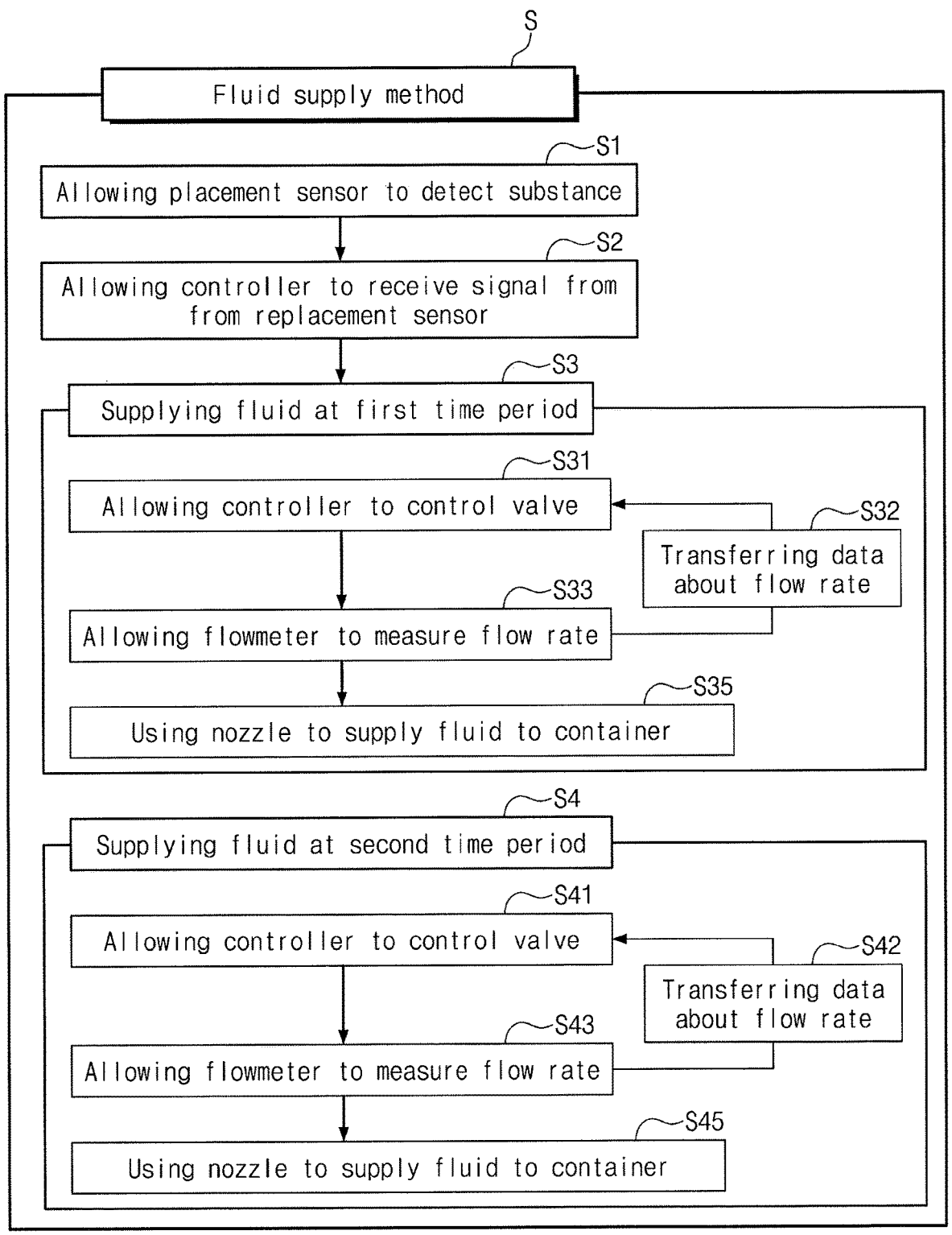
FIG. 4 illustrates a flow chart showing a method of supplying fluid to a semiconductor wafer storage system according to an example embodiment.

FIG. 4 illustrates a flow chart showing a method of supplying fluid to a semiconductor wafer storage system according to an example embodiment.

Referring to FIG. 4, a method S of supplying fluid to the container 1 of the semiconductor wafer storage system may include allowing the placement sensor J to detect a substance (S1), allowing the controller C to receive a signal from the placement sensor J (S2), supplying fluid during a first time period (S3), and supplying fluid during a second time period (S4).

Referring to FIGS. 3 and 4, at the step S1, the placement sensor J may detect the presence of a wafer in the inner space of the container 1. In an example embodiment, the placement sensor J may include a pressure sensor and/or a photo sensor.

At the step S2, when the placement sensor J detects the presence of the wafer, the placement sensor J may transfer a signal to the controller C. Fluid supply may begin when the controller C receives the signal from the placement sensor J.

At the step S3, the inner space of the container 1 may be supplied with the fluid. In an example embodiment, the first time period may begin immediately after the placement sensor J transfers the signal to the controller C. The signal may indicate that a wafer is present in the inner space of the container 1. The first time period may continue for a certain time. For example, the first time period may be about 30 minutes to about 90 minutes. The concentration of the fluid in the inner space of the container 1 may continuously increase during the first time period. The step S3 may include allowing the controller C to control the valve 31 (S31), allowing the flowmeter 33 to measure a flow rate (S33), transferring data about the flow rate (S32), and using a nozzle part to supply a container with fluid (S35).

At the step S31, the controller C may transfer a signal to the valve 31. For example, the controller C may control to open the valve 31. The valve 31 may pass the fluid supplied from the fluid supply F.

At the step S33, the flowmeter 33 may measure a flow rate of the fluid that has passed through the valve 31. The flowmeter 33 may include an electromagnetic flowmeter.

In an example embodiment, the fluid may be provided at a total amount of 10 to 15 times the volume of the space of the container 1, for example, during the first time period. The flow rate of the fluid in the first to third nozzles 51, 53, 55 may be about 0 to 100 L/min. For example, the flow rate of the fluid in the first to third nozzles 51, 53, 55 may be about 10 L/min to 30 L/min. If the flow rate of the fluid is about 10 L/min, the fluid of about 900 liters may be provided in the space of the container 1 during about 90 minutes. If the flow rate of the fluid is about 30 L/min, the fluid of about 900 liters may be provided in the space of the container 1 during about 30 minutes. After about 30 minutes to about 90 minutes, the humidity in the container 1 may be almost zero. If the humidity is zero, an oxidation or a contamination of the wafer in the container 1 can be prevented. The total amount of the fluid flowed by a typical single nozzle may be larger than the total amount of the fluid of the first to third nozzles 51, 53, 55. The total amount of the fluid of the typical single nozzle may be continuously increased in proportion to time. Therefore, the present example embodiment may reduce the consumption of fluid.

At the step S32, the flowmeter 33 may provide the controller C with a signal about the flow rate measured thereby. The controller C may receive data about the flow rate from the flowmeter 33.

In an example embodiment, at the step S32, the controller C may control the valve 31 again, based on the data received from the flowmeter 33. When the flow rate is less than a target value, the controller C may additionally control the valve 31 to increase the flow rate of the fluid passing therethrough. The target value may be 10 L/min to 30 L/min. When the flow rate is greater than the target value, the controller C may additionally control the valve 31 to decrease the flow rate of the fluid passing therethrough. In this sense, the flowmeter 33 may allow the controller C may perform a feedback control. Therefore, the flow rate may be precisely controlled. It may be possible to properly control an amount of the fluid introduced into the inner space of the container 1. It may also be possible to save the fluid introduced into the container 1. Further, costs for fluid supply may be cut down. Thus, process costs may be reduced as a whole.

At the step S35, after passing through the filter 35 and the manifold fitting 37, the fluid may be introduced through the nozzle part into the inner space of the container 1. For example, the fluid may be introduced through the first nozzle 51, the second nozzle 53, and the third nozzle 55 into the inner space of the container 1. The fluid may enter the inner space of the container 1 through the first, second, and third nozzles 51, 53, and 55 at respective flow rates different from each other. In an example embodiment, the fluid may enter the inner space of the container 1 through the first, second, and third nozzles 51, 53, and 55 at a flow rate ratio of (1):(0.8~1.7):(0.8~1.7).

Because the fluid is introduced through two or more of the nozzles 51, 53, and 55, a large amount of the fluid may be supplied at a single time. Because the nozzles 51, 53, and 55 are positioned on different locations, the fluid introduced through the nozzles 51, 53, and 55 may be promptly distributed all over the inner space of the container 1. It may be possible to reduce an amount of the fluid discharged through the exhaust part 71 immediately after being introduced through the nozzles 51, 53, and 55 into the inner space of the container 1. Thus, it may be possible to more efficiently supply the fluid. The fluid may be saved and costs may be reduced. Also, the fluid supply time may be reduced and a time used for processes may be decreased.

At the step S4, the fluid may be supplied to the inner space of the container 1. In an example embodiment, when the total amount of the fluid supplied is 10 to 15 times the volume of the space of the container 1, for example, during the first time period, the second time period may be started. In an example embodiment, the second time period may begin immediately after the first time period is terminated. In an example embodiment, when the concentration of the fluid in the inner space of the container 1 reaches a certain level, the first time period may be terminated and the second time period may be begun. The second time period may continue for a certain time.

During the second time period, the fluid may have a constant concentration in the inner space of the container 1. The step S4 may include allowing a controller to control a valve (S41), allowing a flowmeter to measure a flow rate (S43), transferring data about the flow rate (S42), and using a nozzle to supply a container with fluid (S45). The flow rate of the fluid in the second time period may be 1 L/min or less. In another implementation, the flow rate of the fluid in the second time period may be zero or near zero. The flow rate of the fluid in the second time period may be constant.

At the step S41, the controller C may transfer a signal to the valve 31. For example, the controller C may control to open the valve 31. The valve 31 may pass the fluid supplied from the fluid supply F.

At the step S43, the flowmeter 33 may measure the flow rate of the fluid that has passed through the valve 31. In an example embodiment, the flowmeter 33 may include an electromagnetic flowmeter.

At the step S42, the flowmeter 33 may provide the controller C with a signal about the flow rate measured thereby. The controller C may receive data about the flow rate from the flowmeter 33.

In an example embodiment, at the step S42, the controller C may control the valve 31 again, based on the data received from the flowmeter 33. When the flow rate is less than a target value, the controller C may additionally control the valve 31 to increase the flow rate of the fluid passing therethrough. When the flow rate is greater than a target value, the controller C may additionally control the valve 31 to decrease the flow rate of the fluid passing therethrough. In this sense, the flowmeter 33 may allow the controller C may perform a feedback control. Therefore, the flow rate may be precisely controlled. It may be possible to properly control an amount of the fluid introduced into the inner space of the container 1. It may also be possible to save the fluid introduced into the container 1. Further, costs for fluid supply may be cut down. Thus, process costs may be reduced as a whole.

At the step S45, after passing through the filter 35 and the manifold fitting 37, the fluid may be introduced through the nozzle part into the inner space of the container 1. For example, the fluid may be introduced through the first nozzle 51, the second nozzle 53, and the third nozzle 55 into the inner space of the container 1. The fluid may enter the inner space of the container 1 through the first, second, and third nozzles 51, 53, and 55 at respective flow rates different from each other. In an example embodiment, the fluid may enter the inner space of the container 1 through the first, second, and third nozzles 51, 53, and 55 at a flow rate ratio of (1):(0.8~1.7):(0.8~1.7).

The fluid supplied during the first time period and the fluid supplied during the second time period may be the same fluid or of the same kind. For example, the same kind of fluid may be continuously supplied from the start of the first time period to the end of the second time period. In an example embodiment, the flow rate of the fluid supplied at the second time period may be less than that of the fluid supplied at the first time period. This will be further discussed below with reference to FIG. 5.

Figure 5:
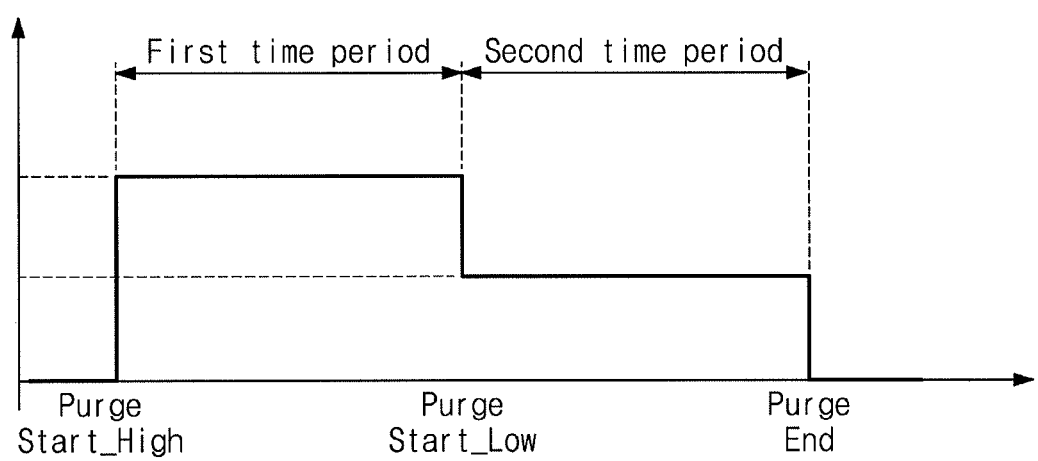
FIG. 5 illustrates a graph showing a procedure for supplying fluid to a semiconductor wafer storage system according to an example embodiment.

FIG. 5 illustrates a graph showing a procedure for supplying fluid to a semiconductor wafer storage system according to an example embodiment.

Referring to FIGS. 3 and 5, a horizontal axis may indicate the passage of time. A vertical axis may denote the flow rate of the fluid introduced into the inner space of the container 1 from the fluid supply F.

When the step S2 of allowing the controller C to receive a signal from the placement sensor J is terminated, the step S3 may begin such that the fluid is supplied at the first time period. The step S3 may begin at a point of Purge Start High. The first time period may continue for a certain time. For example, the first time period may be about 30 minutes to about 90 minutes. The first time period may continue until a concentration of the fluid in the inner space of the container 1 reaches a certain level. When the concentration of the fluid in the inner space of the container 1 reaches a certain level, the first time period may be terminated. When the first time period is terminated, the step S4 may begin such that the fluid is supplied at the second time period. If the total amount of the fluid is 10 to 15 times the volume of the space of the container 1, the first time period is terminated. The step S4 may begin at a point of Purge Start_Low. The flow rate of the fluid introduced into the inner space of the container 1 at the second time period may be less than that of the fluid introduced into the inner space of the container 1 at the first time period. When, at the first time period, the concentration of the fluid in the inner space of the container 1 has a certain level, the fluid may be introduced at the second time period at a small amount enough to supplement the fluid discharged through the exhaust part 71. For example, the flow rate of the fluid discharged through the exhaust part 71 at the second time period may be substantially the same as or similar to that of the fluid introduced through the nozzle part. Because the flow rate of the fluid introduced at the second time period may be reduced, it may be possible to save the fluid consumption.

In an example embodiment, when the placement sensor J confirms that the wafer is unloaded from the inner space of the container 1, the controller C may stop the introduction of the fluid. The end of fluid introduction may be executed at a point of Purge End shown in FIG. 5. The second time period may be terminated at the point of Purge End.

By way of summation and review, during storage, it may be important to protect wafers against oxidation, minute particles, or the like. Accordingly, the wafers may be kept in an environment that is free of oxygen. A wafer storage apparatus may be filled with an inert gas to isolate wafers from the outside. For example, when wafers are loaded in the storage apparatus, the inert gas may be introduced into the storage apparatus and then may dispel other gases from the storage apparatus. Therefore, wafers may be protected from oxygen, minute particles, or the like. The inert gas may be, for example, nitrogen or argon.

According to an example embodiment, a semiconductor wafer storage system may be configured to use a plurality of nozzles to supply a fluid to an inner space of a wafer storage container. Therefore, the fluid may be promptly distributed all over the inner space of the container. A first time period for initially purging the inner space of the wafer storage container may be reduced, and a second time period for maintaining the fluid in the inner space of the wafer storage container may be started relatively promptly and may use a reduced flow rate of the fluid relative to that used during the first time period. The fluid may be saved and then costs may be reduced.

According to example embodiments, a semiconductor wafer storage system and a method of supplying a fluid for semiconductor wafer storage may save fluid and reduce costs.

According to example embodiments, a semiconductor wafer storage system and a method of supplying a fluid for semiconductor wafer storage may reduce an amount of fluid used and decrease an amount of time used for processes.

The methods, processes, and/or operations described herein may be performed, at least partially, by code or instructions to be executed by a computer, processor, controller, or other signal processing device in the substrate treating apparatus of the embodiments. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers and other processing features described herein may be implemented in logic which, for example, may include hardware, software, or both. When implemented at least partially in hardware, the controllers and other processing features may be, for example, any one of a variety of integrated circuits including but not limited to an application-specific integrated circuit, a field-programmable gate array, a combination of logic gates, a system-on-chip, a microprocessor, or another type of processing or control circuit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor wafer storage system, comprising:
 a container that provides a space in which a semiconductor wafer is to be stored;
 a fluid supply that provides a fluid to the container;
 a connection part that receives the fluid from the fluid supply and transfers the fluid to the container; and
 a nozzle part that connects the connection part to the container, wherein:
 the container includes a coupling plate to which the nozzle part is coupled,
 the nozzle part includes a first nozzle, a second nozzle, and a third nozzle adjacent to respective corners of the coupling plate,
 the connection part includes a manifold fitting that branches a path of the fluid passing from the fluid supply to the first, second, and third nozzles, and
 the connection part further includes:
 a first supply line that connects the first nozzle and the manifold fitting to each other;
 a second supply line that connects the second nozzle and the manifold fitting to each other; and
 a third supply line that connects the third nozzle and the manifold fitting to each other.

2. The system as claimed in claim 1, wherein:
 the nozzle part further includes:
 a sidewall disposed on an edge of the coupling plate; and
 an upper plate covering the sidewall and the coupling plate, and the coupling plate has a shape of quadrangle having first to fourth corners.

3. The system as claimed in claim 2, further comprising an exhaust part exhausting the fluid in the container,
 wherein the exhaust part is adjacent to the fourth corner.

4. The system as claimed in claim 2, wherein:
 the connection part further includes a filter that filters an impurity of the fluid, and
 the manifold fitting receives the fluid passing through the filter.

5. The system as claimed in claim 1, wherein the first, second, and third supply lines have different lengths from each other.

6. The system as claimed in claim 1, wherein the connection part further includes:
- a valve that adjusts a flow rate of the fluid supplied from the fluid supply;
- a flowmeter that measures the flow rate of the fluid passing through the valve; and
- a controller that controls the valve.

7. The system as claimed in claim 1, wherein:
during a first time period, the fluid supply provides the fluid to the container at at least ten times a volume of the space.

8. The system as claimed in claim 7, wherein:
the volume of the space is 64 liters, and
the fluid supply provides the fluid of 900 liters to the space during the first time period.

9. A semiconductor wafer storage system, comprising:
a wafer container accommodating a semiconductor wafer;
a fluid supply providing a fluid to the wafer container;
a nozzle part connecting the wafer container to the fluid supply and providing the fluid in the wafer container; and
an exhaust part exhausting the fluid in the wafer container, wherein:
the wafer container has a shape of a hexahedron,
the nozzle part includes a first nozzle, a second nozzle, and a third nozzle adjacent to respective corners of a lower surface of the hexahedron,
a connection part receives the fluid from the fluid supply and transfers the fluid to the wafer container, the connection part including a manifold fitting that branches a path of the fluid passing from the fluid supply to the first, second, and third nozzles, and
the connection part further includes:
- a first supply line that connects the first nozzle and the manifold fitting to each other:
- a second supply line that connects the second nozzle and the manifold fitting to each other; and
- a third supply line that connects the third nozzle and the manifold fitting to each other.

10. The system as claimed in claim 9, wherein:
the exhaust part is adjacent to another corner of the lower surface of the hexahedron.

11. The system as claimed in claim 9, wherein:
the wafer container has an inner space in the hexahedron, and
during a first time period of about 30 minutes to about 90 minutes, the fluid supply provides the fluid to the inner space at at least ten times a volume of the inner space.

12. The system as claimed in claim 11, wherein:
the volume of the inner space is has a volume of 64 liters, and the fluid supply provides the fluid of 900 liters to the inner space during the first time period.

13. A semiconductor wafer storage system, comprising:
a gas supply providing an inert gas; and
a wafer container having a coupling plate connected to the gas supply and accommodating a semiconductor wafer, wherein:
the wafer container includes:
- a first nozzle hole, a second nozzle hole, and a third nozzle hole adjacent to respective corners of the coupling plate to provide the inert gas to the wafer container;
- an exhaust hole adjacent to another corner of the coupling plate to exhaust the inert gas in the wafer container;
- a connection part that receives the inert gas from the gas supply and transfers the inert gas to the wafer container, the connection part including:
- a manifold fitting that branches a path of the inert gas passing from the gas supply to the first, second, and third nozzle holes,
- a first supply line that connects the first nozzle hole and the manifold fitting to each other,
- a second supply line that connects the second nozzle hole and the manifold fitting to each other, and
- a third supply line that connects the third nozzle hole and the manifold fitting to each other.

14. The system as claimed in claim 13, wherein:
the wafer container has an inner space, and
during a first time period of about 30 minutes to about 90 minutes, the gas supply provides the inert gas to the inner space at at least ten times a volume of the inner space.

15. The system as claimed in claim 14, wherein:
the volume of the inner space is 64 liters, and
the gas supply provides the inert gas of 900 liters to the inner space during the first time period.

16. The system as claimed in claim 13, wherein:
the wafer container is cubic.

* * * * *